(12) United States Patent
Song

(10) Patent No.: US 9,530,465 B2
(45) Date of Patent: Dec. 27, 2016

(54) SEMICONDUCTOR MEMORY DEVICE

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 484 days.

(21) Appl. No.: 14/106,811

(22) Filed: Dec. 15, 2013

(65) Prior Publication Data

US 2015/0127870 A1  May 7, 2015

(30) Foreign Application Priority Data

Nov. 4, 2013 (KR) ........................ 10-2013-0132838

(51) Int. Cl.
  *G11C 7/10* (2006.01)
  *G11C 7/18* (2006.01)
(52) U.S. Cl.
  CPC ............ *G11C 7/1003* (2013.01); *G11C 7/1048* (2013.01); *G11C 7/18* (2013.01)
(58) Field of Classification Search
  CPC ........ G11C 7/1003; G11C 7/1048; G11C 7/18
  See application file for complete search history.

(56) References Cited

U.S. PATENT DOCUMENTS 5,570,381 A * 10/1996 Schofield ............... G11C 29/14
  365/201

FOREIGN PATENT DOCUMENTS

KR    1020080087441    10/2008
KR    1020090067801    6/2009

* cited by examiner

*Primary Examiner* — Farley Abad
(74) *Attorney, Agent, or Firm* — IP & T Group LLP

(57) ABSTRACT

A semiconductor memory device includes a first global line suitable for inputting/outputting data from/to a first bank, a second global line suitable for inputting/outputting data from/to a second bank, a multi-purpose register (MPR) suitable for loading data having a predetermined value on the first global line in a training mode, a first data input/output (I/O) unit suitable for inputting/outputting data between one of the first and second global lines and a first data pad and selectively transferring data loaded on the first global line to the second global line in response to a bandwidth option in the training mode, and a second data I/O unit enabled in response to the bandwidth option, suitable for inputting/outputting data between the second global line and a second data pad.

18 Claims, 7 Drawing Sheets

SEMICONDUCTOR MEMORY DEVICE

CROSS-REFERENCE TO RELATED APPLICATIONS

The present application claims priority of Korean Patent Application No. 10-2013-0132838, filed on Nov. 4, 2013, which is incorporated herein by reference in its entirety.

BACKGROUND

1. Field

Exemplary embodiments of the present invention relate to a semiconductor design technique, and more particularly, to a semiconductor memory device having a data transfer path.

2. Description of the Related Art

In general, a semiconductor memory device includes a plurality of memory banks, each of which is composed of plural memory cells.

The semiconductor memory device is designed to provide a plurality of data bandwidths to operate. For example, a semiconductor memory device, which supports both of an X8 mode and an X16 mode and has 16 input/output (I/O) pads, performs a data I/O operation with the 16 I/O pads when the data bandwidth option is set to an X16 mode while utilizing 8 of the 16 I/O pads when the data bandwidth option is set to an X8 mode.

For example, the semiconductor device having two memory banks, each of which corresponds to 8 I/O pads, selects all of two memory banks and performs the data I/O operation with both of the memory banks at the same time during the X16 mode while selecting one of the two memory banks and performing the data I/O operation with the selected memory bank during the X8 mode.

A multi-purpose register (MPR) provides information storage for additional operation such as a training operation. The MPR stores a predefined data pattern, for example, a training data with a preset data pattern. During a MPR mode, the MPR outputs the preset data for a specific operational purpose, irrespective of normal read and write operation to data stored on memory cells. With the MPR, it is possible to perform a tuning operation for guaranteeing a high-speed operation between a semiconductor system and a memory chip.

FIG. 1 is a block diagram illustrating a conventional semiconductor memory device.

Referring to FIG. 1, the conventional semiconductor memory device includes first to fourth banks 10 to 40, first to fourth global lines GIO_UR[63:0], GIO_DR[63:0], GIO_UL[63:0] and GIO_DL[63:0], a MPR 50 first and second data I/O units 60 and 70, first and second repeaters 80 and 90, first and second data pads DQ[0:7] and DQ[8:15].

The first to fourth banks 10 to 40 receive/output a normal data through the first to fourth global lines GIO_UR[63:0], GIO_DR[63:0], GIO_UL[63:0] and GIO_DL[63:0], respectively. The MPR 50 loads a training data having a predetermined data pattern on the first and second global fine GIO_UR[63:0] and GIO_DR[63:0] in a training mode.

The first data I/O unit 60 transfers data between the first data pads DQ[0:7] and the first to fourth global lines GIO_UR[63:0], GIO_DR[63:0], GIO_UL[63:0] and GIO_DL[63:0], irrespective of a bandwidth option. The second data I/O unit 70, which is enabled according to the bandwidth option, transfers data between the second data pads DQ[8:15l ] and the third and fourth global lines GIO_UL[63:0] and GIO_DL[63:0].

The first repeater 80 transfers data loaded on the first global line GIO_UR[63:0] to the third global line GIO_UL[63:0] according to the bandwidth option in the training mode. The second repeater 90 transfers data loaded on the second global line GIO_DR[63:0] to the fourth global line GIO_DL[63:0] according to the bandwidth option in the training mode.

For example, the first data pads DQ[0:7] and the first to fourth global lines GIO_UR[63:0], GIO_DR[63:0], GIO_UL[63:0] and GIO_DL[63:0] work irrespective of the bandwidth option of the 8 I/O mode and the 16 I/O mode while the second data pads DQ[8:15] and the third and fourth global lines GIO_UL[63:0] and GIO_DL[63:0] work according to the bandwidth option of the 16 I/O mode. The first and second repeater 80 and 90 work during the training mode.

The conventional semiconductor memory device has a concern as follows.

In the training mode, the training data stored in the MPR 50 are loaded on the first global line GIO_UR[63:0] and the second global line GIO_DR[63:0].

In the X8 mode, the first data output unit 62 outputs the training data loaded on one of the first global line GIO_UR[63:0] and the second global line GIO_DR[63:0] to the first data pads DQ[0:7].

In the X16 mode, the first repeater 80 forwards the training data loaded on the first global line GIO_UR[63:0] to the third global line GIO_UL[63:0]. Also, the second repeater 90 forwards the training data loaded on the second global line GIO_DR[63:0] to the fourth global line GIO_DL[63:0]. Then, the first data output unit 62 and the second data output unit 72 output the training data loaded on the first to fourth global lines GIO_UR[63:0], GIO_DR[63:0], GIO_UL[63:0] and GIO_DL[63:0] to the first data pads DQ[0:7] and the second data pads DQ[8:15], respectively.

In a normal mode and the X8 mode, the first data I/O unit 60 forwards a normal data between the first data pads DQ[0:7] and the first to fourth global lines GIO_UR[63:0] GIO_DR[63:0], GIO_UL[63:0] and GIO_DL[63:0].

In the normal mode and the X16 mode, the first data I/O unit 60 forwards the normal data between the first data pads DQ[0:7] and the first and second global lines GIO_UR[63:0] and GIO_DR[63:0], Also, the second data I/O unit 70 forwards the normal data between the second data pads DQ[8:15] and the third and fourth global lines GIO_UL[63:0] and GIO_DL[63:0].

Different from the training mode, the first and second repeaters 80 and 90 are not involved in data transfer in the normal mode. Since each of the global lines is composed of 64 lines, each of which has a relatively long length, the first and second repeaters 80 and 90 when utilized solely for the training mode have a relatively large drivability, which is a burden of semiconductor design in view of size of the semiconductor device.

SUMMARY

Various exemplary embodiments according to the present invention are directed to a semiconductor memory device capable of efficiently transferring data between global lines without a repeater.

In an exemplary embodiment, a semiconductor memory device may include a first global line suitable for inputting/outputting data from/to a first bank, a second global line suitable for inputting/outputting data from/to a second bank, a multi-purpose register (MPR) suitable for loading data having a predetermined value on the first global line in a training mode, a first data input/output (I/O) unit suitable for inputting/outputting data between one of the first and second global lines and a first data pad and selectively transferring data loaded on the first global line to the second global line in response to a bandwidth option in the training mode and a second data I/O unit enabled in response to the bandwidth option, suitable for inputting/outputting data between the second global line and a second data pad.

In an exemplary embodiment, a semiconductor memory device may include a first global line suitable for inputting/outputting data from/to a first bank, a second global line suitable for inputting/outputting data from/to a second bank, a third global line suitable for inputting/outputting data from/to a third bank, a fourth global line suitable for inputting/outputting data from/to a fourth bank; a multi-purpose register (MPR) suitable for loading data having a predetermined value on the first global line in a training mode, a first data input/output (I/O) unit suitable for inputting/outputting data between one of the first to fourth global lines and a first data pad and selectively transferring data loaded on the first and second global lines to the third and fourth global lines, respectively, in response to a bandwidth option in the training mode and a second data I/O unit enabled in response to the bandwidth option, suitable for inputting outputting data between one of the third and fourth global lines and a second data pad.

In an exemplary embodiment, a semiconductor memory device may include a first group of global lines, a second group of global lines, a first unit coupled to both of the first and second groups and suitable for transferring a first data between a data pad group and one of the first and second groups, and a second unit coupled to the second group and suitable for transferring a second data between the data pad group and the second group during an extended bandwidth mode, wherein the first unit further transfers a preset data having a preset data pattern from the first group to the second group during the extended bandwidth mode.

The preset data may be a training data stored in a multi-purpose register. The first group of global lines may include one or more global lines, each of which is coupled to a corresponding memory bank. The second group of global lines may include one or more global lines, each of which is coupled to a corresponding memory bank.

DETAILED DESCRIPTION

Figure 1:
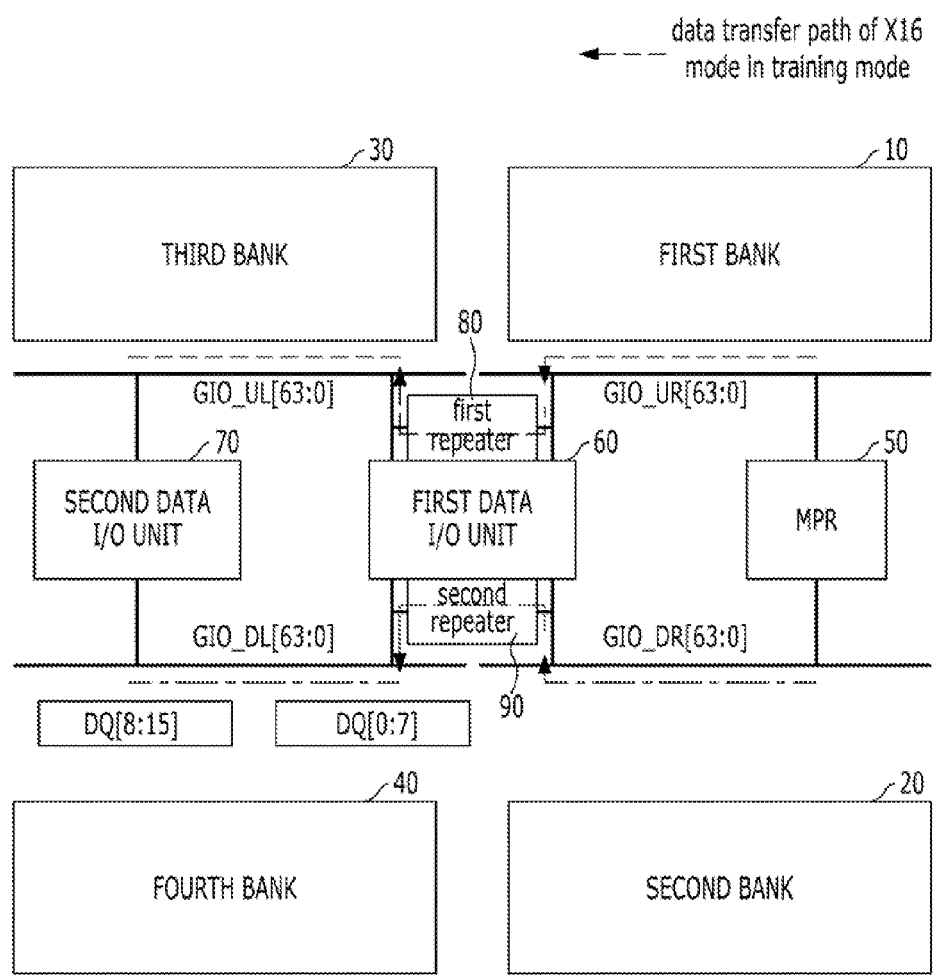
FIG. 1 is a block diagram illustrating a conventional semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, "and/or" represents that one or more of components arranged before and after "and/or" is included. Furthermore, "connected/coupled" refers to one component not only directly coupling another component but also indirectly coupling another component through an intermediate component. In addition, a singular form may include a plural form as long as it is not specifically mentioned in a sentence. Furthermore, "include/comprise" or "including/comprising" used in the specification represents that one or more components, steps, operations, and elements exists or are added.

In the description, a training data is taken as an example and may represent a data with a predetermined data pattern stored in a MPR. Also, the bandwidth modes of the X8 and the X16 are taken as an example and represent a default bandwidth mode and an extended bandwidth mode, respectively, whose variation falls in the scope of the present invention.

Figure 2:
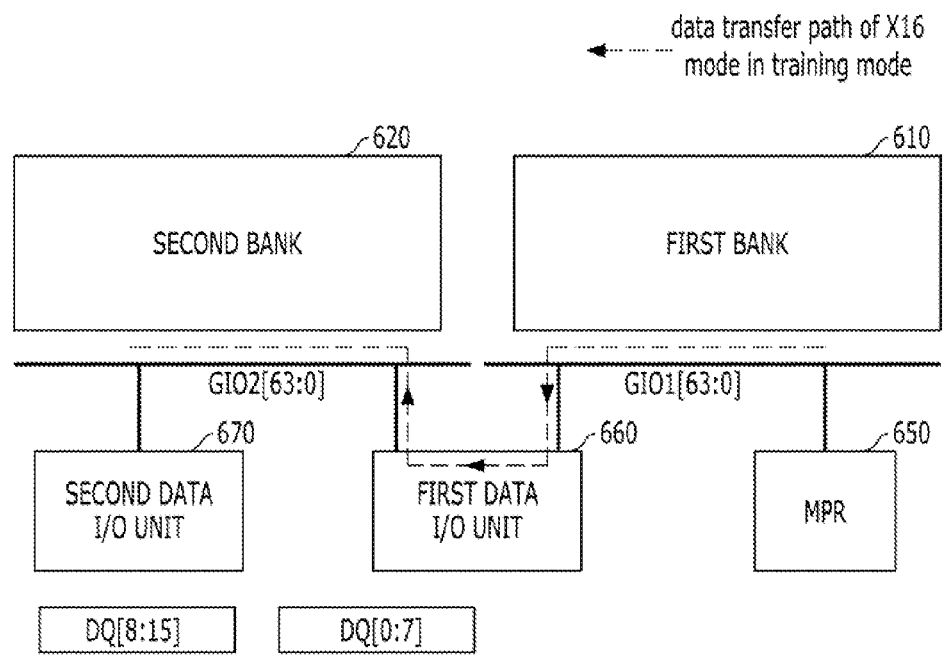
FIG. 2 is a block diagram illustrating a semiconductor memory device in accordance with an exemplary embodiment of the present invention.

FIG. 2 is a block diagram illustrating a semiconductor memory device in accordance with an exemplary embodiment of the present invention.

Referring to FIG. 2, the semiconductor memory device includes first and second banks 610 and 620, first and second global lines GIO1[63:0] and GIO2[63:0], a MPR 650, first and second data I/O units 660 and 670 and first and second data pads DQ[0:7] and DQ[8:15].

The first and second banks 610 and 620 may receive/output a normal data through the first and second global lines GIO1[63:0] and GIO2[63:0], respectively.

The MPR 650 may load a training data through the first global line GIO1[63:0] in a training mode. The MPR 650 may receive the training data through the first global line GIO1[63:0] as a design variation.

The first data I/O unit 660 may transfer the normal data or the training data between the first data pads DQ[0:7] and one of the first and second global lines GIO1[63:0] and GIO2[63:0]. In the training mode and the X16 mode, the first data I/O unit 660 may transfer the training data loaded on the first global line GIO1[63:0] to the second global line GIO2[63:0].

The second data I/O unit 670 may be enabled according to the bandwidth option and transfer the normal data and the training data between the second data pads DQ[8:15] and the second global line GIO2[63:0].

Figure 3:
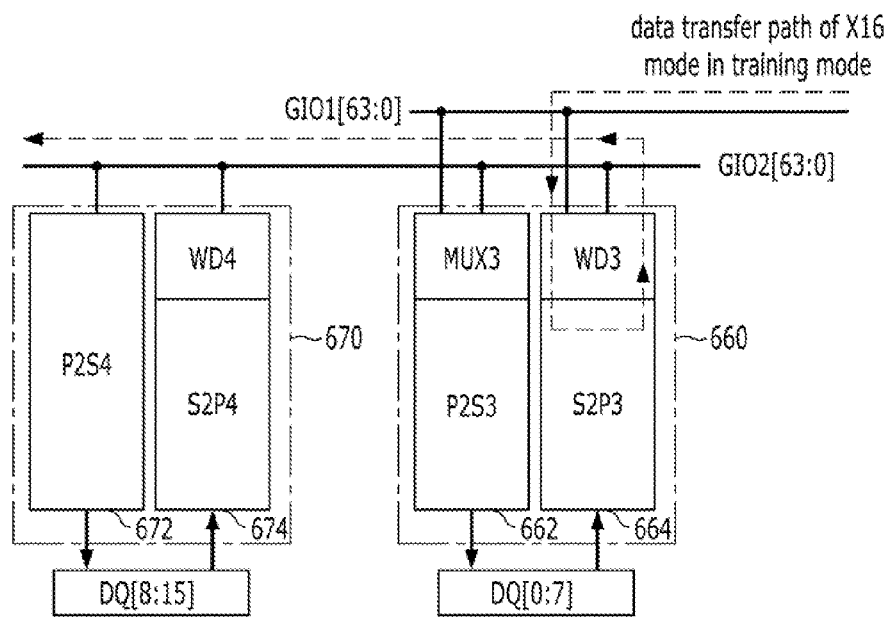
FIG. 3 is a detailed block diagram illustrating first and second data I/O units shown in FIG. 2.

FIG. 3 is a detailed block diagram illustrating the first and second data I/O units 660 and 670 shown in FIG. 2.

Referring to FIG. 3, the first data I/O unit 660 may be coupled to both of the first and second global lines GIO1[63:0] and GIO2[63:0] while the second data I/O unit 670 may be coupled to the second global line GIO2[63:0], since the first data I/O unit 660 may operate irrespective of the bandwidth option while the second data I/O unit 670 may operate in the X16 mode.

In the X16 mode in which the first data pads DQ[0:7] and the second data pads DQ[8:15] are used, both of the first and second data I/O units 660 and 670 may operate. Accordingly, the first data I/O unit 660 may transfer the normal or training data between the first global line GIO1[63:0] and the first data pads DQ[0:7] and the second data I/O unit 670 may transfer the normal or training data between the second global line GIO2[63:0] and the second data pads DQ[8:15].

In the X8 mode in which only the first data pads DQ[0:7] are used, only the first data I/O unit 660 may operate. Accordingly, the first data I/O unit 660 may transfer the normal or training data between the first data pads DQ[0:7] and one of the first and second global lines GIO1[63:0] and GIO2[63:0]. The second data I/O unit 670 is disabled during the X8 mode.

The first data I/O unit 660 may include a first data output unit 662 and a first data input unit 664, and the second data I/O unit 670 may include a second data output unit 672 and a second data input unit 674. The first data I/O unit 660 may operate, irrespective of the bandwidth option and the normal and training modes. The second data I/O unit 670 may operate only during the X16 mode, irrespective of the normal and training modes.

The first data output unit 662 may output the data loaded on the first global line GIO1[63:0] or the second global line GIO2[63:0] to the first data pads DQ[0:7]. The first data output unit 662 may include a first data selection multiplexer MUX3 and a first parallel-to-serial converter P2S3. The first data selection multiplexer MUX3 may selectively receive the data from one of the first and second global lines GIO1[63:0] and GIO2[63:0] in parallel and the first parallel-to-serial converter P2S3 may serialize the received 64-bit data into 8-bit data and output the serialized 8-bit data to the first data pads DQ[0:7].

The first data output unit 662 may output the data loaded on one of the first and second global lines GIO1[63:0] and GIO2[63:0] to the first data pads DQ[0:7], irrespective of the bandwidth option.

The first data input unit 664 may include a first serial-to-parallel converter S2P3 and a first writer driver WD3. The first data input unit 664 may load the normal data inputted through the first data pads DQ[0:7] on one of the first and second global lines GIO1[63:0] and GIO2[63:0] in the normal mode. In the normal mode, the first serial-to-parallel converter S2P3 may parallelize 8-bit data inputted through the first data pads DQ[0:7] into 64-bit data and the first writer driver WD3 may drive one of the first and second global lines GIO1[63:0] and GIO2[63:0] with the 64-bit data.

Also the first data input unit 664 may selectively transfer the training data from the first global line GIO1[63:0] to the second global line GIO2[63:0] according to the bandwidth option in the training mode. In the training mode, the first serial-to-parallel converter S2P3 and the first writer driver WD3 may selectively transfer the training data from the first global line GIO1[63:0] to the second global line GIO2[63:0] during the X16 mode. Particularly, in the X16 mode and the training mode, the training data loaded on the first global line GIO1[63:0] may be transferred to the second global line GIO2[63:0] through the first writer driver WD3 and the first serial-to-parallel converter S2P3.

In the normal mode, the first data input unit 664 may load the normal data inputted through the first data pads DQ[0:7] on one of the first and second global lines GIO1[63:0] and GIO2[63:0], irrespective of the bandwidth option. In the training mode, the first data input unit 664 may transfer the training data from the first global line GIO1[63:0] to the second global line GIO2[63:0] only during the X16 mode.

Figure 4:
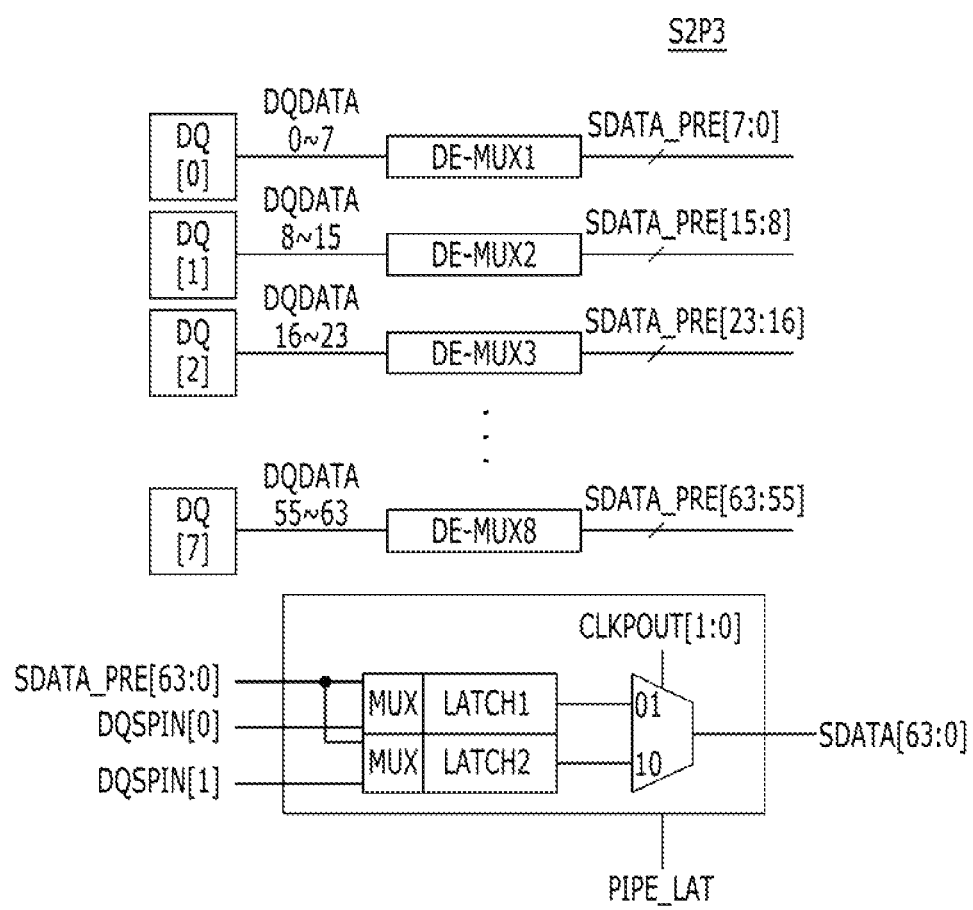
FIG. 4 is a detailed block diagram illustrating first serial-to-parallel converter shown in FIG. 3.

FIG. 4 is a detailed block diagram illustrating the first serial-to-parallel converter S2P3 shown in FIG. 2 operating in the normal mode.

Referring to FIG. 4, the first serial-to-parallel converter S2P3 includes a plurality of demultiplexers DEMUXs DEMUX1 to DEMUX8 and a pipe latch PIPE_LAT.

In the normal mode, the demultiplexers DEMUXs DEMUX1 to DEMUX8 may generate 64-bit parallel data SDATA_PRE[63:0] by de-multiplexing 64-bit data DQDATA 0~7, DQDATA 8~15, DQDATA 16~23, . . . , DQDATA 55~63, which are inputted through the first data pads DQ[0:7] in units of 8-bit serial data.

The pipe latch PIPE_LAT may generate internal data SDATA[63:0] by performing a domain-crossing operation on the 64-bit parallel data SDATA_PRE[63:0]. The domain-crossing operation is performed to change a data domain of the 64-bit parallel data SDATA_PRE[63:0] into a clock domain of the internal data SDATA[63:0] to be loaded on one of the first and second global lines GIO1[63:0] and GIO2[63:0]. The 64-bit parallel data SDATA_PRE[63:0] may be stored in latches LATCH1 and LATCH2 of the pipe latch PIPE_LAT in response to strobe signals DQSPIN[0:1] which are synchronized with the data domain and then the 64-bit parallel data SDATA_PRE[63:0] stored in the latches LATCH1 and LATCH2 may be outputted as the internal data SDATA[63:0] in response to clock signals CLKPOUT[0:1] which are synchronized with the clock domain.

Referring back to FIG. 3, the second data output unit 672 may be enabled according to the X16 mode and output the normal or training data loaded on the second global line GIO2[63:0] to the second data pads DQ[8:15]. The second data output unit 672 may include a second parallel-to-serial converter P2S4. The second parallel-to-serial converter P2S4 may serialize the 64-bit parallel data loaded on the second global line GIO2[63:0] into 8-bit data and output the serialized 8-bit data to the second data pads DQ[8:15].

In the normal mode, the second data output unit 672 may be enabled only during the X16 mode. In the training mode, the second data output unit 672 may be enabled to output the training data transferred from the first global line GIO1[63:0] and loaded on the second global line GIO2[63:0] to the second data pads DQ[8:15] only during the X16 mode.

The second data input unit 674 may be enabled according to the X16 mode and load the normal data inputted through the second data pads DQ[8:15] on the second global line GIO2[63:0]. The second data input unit 674 may include a second serial-to-parallel converter S2P4 and a second writer driver WD4. The second serial-to-parallel converter S2P4 may parallelize the 8-bit data inputted through the second data pads DQ[8:15] into the 64-bit data and the second writer driver WD4 may drive the second global line GIO2[63:0] with the 64-bit data.

In the normal mode, the second data input unit 674 may be enabled only during the X16 mode. The second data input unit 674 may operate only during the X16 mode, irrespective of the normal and training modes.

An operation of the first data input unit 664 to transfer the training data from the first global line GIO1[63:0] to the second global line GIO2[63:0] in the training mode will now be described.

As described above in connection with FIG. 4, the pipe latch PIP_LAT may be provided in the first serial-to-parallel converter S2P3 of the first data input unit 664 to perform the domain-crossing operation in the normal mode on the normal data inputted through the first data pads DQ[0:7] and parallelized.

In the exemplary embodiment of the present invention, an independent storage such as the pipe latch PIPE_LAT may also be used to store the training data transferred from the first global line GIO1[63:0] in the X16 mode of the training mode. Thereafter, the first writer driver WD3 may transfer the training data, which is transferred from the first global line GIO1[63:0] and stored in pipe latch PIPE_LAT, to the second global line GIO2[63:0] in the X16 mode of the training mode. Accordingly, the first data input unit 664 may transfer the training data loaded on the first global line GIO1[63:0] to the second global line GIO2[63:0] without changing the internal structural configuration of the semiconductor device when an existing storage is provided.

Figure 5:
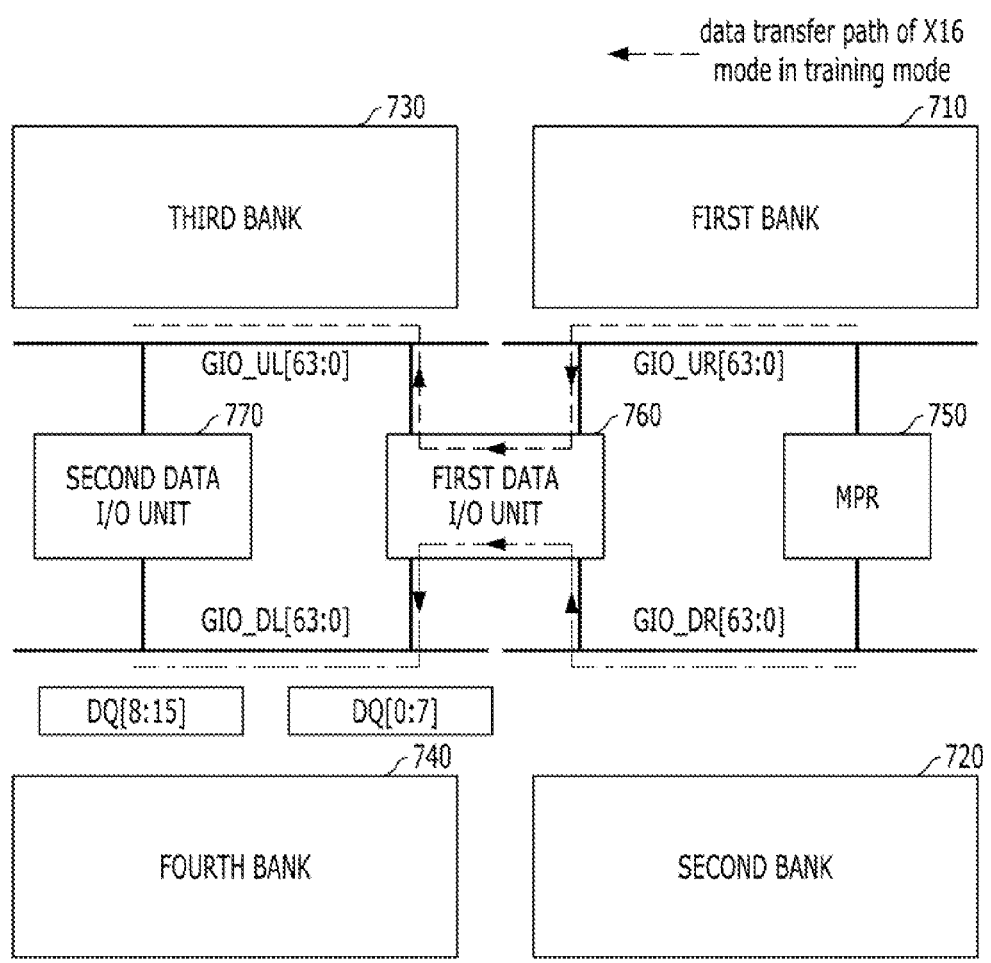
FIG. 5 is a block diagram illustrating a semiconductor memory device in accordance with an exemplary embodiment of the present invention.

FIG. 5 is a block diagram illustrating a semiconductor memory device in accordance with an exemplary embodiment of the present invention.

Referring to FIG. 5, the semiconductor memory device may include first to fourth banks 710 to 740, first to fourth global lines GIO_UR[63:0] GIO_DR[63:0], GIO_UL[63:0] and GIO_DL[63:0], a MPR 750, first and second data I/O units 760 and 770 and first and second data pads DQ[0:7] and DQ[8:15].

The first bank 710 may transfer data from/to the first global line GIO_UR[63:0]. The second bank 720 may transfer data from/to the second global line GIO_DR[63:0]. The third bank 730 may transfer data from/to the third global line GIO_UL[63:0]. The fourth bank 740 may transfer data from/to the fourth global line GIO_DL[63:0].

The first to fourth banks 710 to 740 may receive/output the normal data through the first to fourth global lines GIO_UR[63:0], GIO_DR[63:0] GIO_UL[63:0] and GIO_DL[63:0], respectively. The MPR 750 may receive/output the training data having a predetermined data pattern from/to the first and second global lines GIO_UR[63:0] and GIO_DR[63:0] in the training mode. FIG. 5 shows the MPR 750 that loads the training data on the first global line GIO_UR[63:0] or the second global line GIO_DR[63:0]. The MPR 750 may receive the training data from the first global line GIO_UR[63:0] or the second global line GIO_DR[63:0] as a design variation.

The first data I/O unit 760 may transfer the normal or training data between the first data pads DQ[0:7] and one of the first to fourth global lines GIO_UR[63:0], GIO_DR[63:0], GIO_UL[63:0] and GIO_DL[63:0]. In the training mode and the X16 mode, the first data I/O unit 760 may transfer the training data loaded on the first global line GIO_UR[63:0] to the third global line GIO_UL[63:0] or the training data loaded on the second global line GIO_DR[63:0] to the fourth global line GIO_DL[63:0].

The second data I/O unit 770 may be enabled according to the bandwidth option and may transfer the normal or training data between the second data pads DQ[8:15] and one of the third and fourth global lines GIO_UL[63:0] and GIO_DL[63:0].

Figure 6:
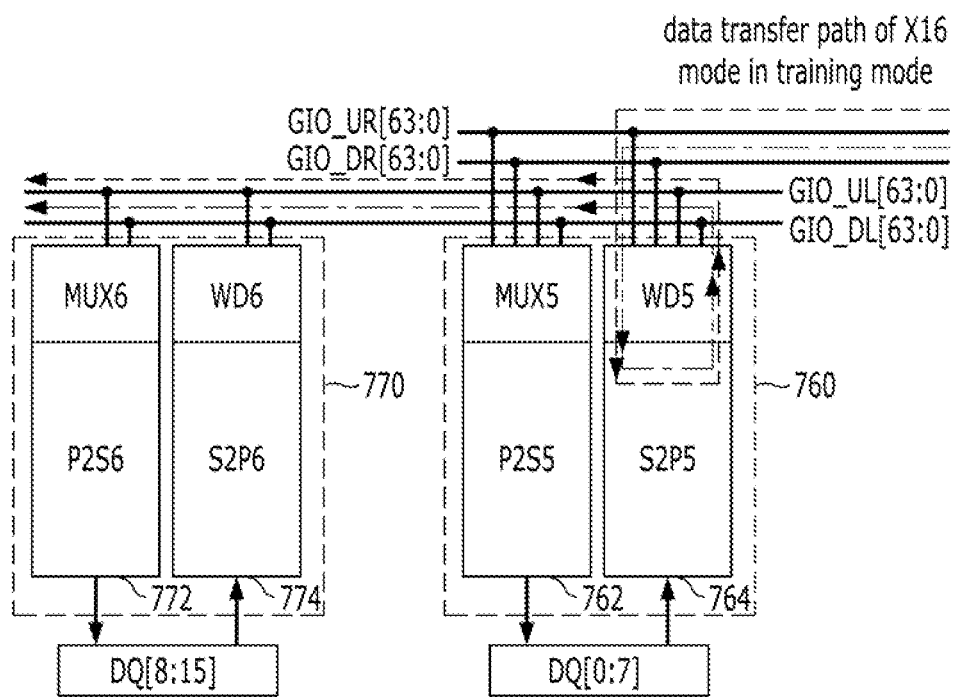
FIG. 6 is a detailed block diagram illustrating first and second data I/O units shown in FIG. 5.

FIG. 6 is a detailed block diagram illustrating the first and second data I/O units 760 and 770 shown in FIG. 5.

Referring to FIG. 6, the first data I/O unit 760 may be coupled to all of the first to fourth global lines GIO_UR[63:0], GIO_DR[63:0], GIO_UL[63:0] and GIO_DL[63:0] while the second data I/O unit 770 may be coupled to the third and fourth global lines GIO_UL[63:0] and GIO_DL[63:0], since the first data I/O unit 760 may operate irrespective of the bandwidth option while the second data I/O unit 770 may operate in the X16 mode.

In the X16 mode in which the first data pads DQ[0:7] and the second data pads DQ[8:15] are used, both of the first and second data I/O units 760 and 770 may operate. Accordingly, the first data I/O unit 760 may transfer the normal or training data between one of the first and second global lines GIO_UR[63:0] and GIO_DL[63:0] and the first data pads DQ[0:7] and the second data I/O unit 770 may transfer the normal or training data between one of the third and fourth global lines GIO_UL[63:0] and GIO_DL[63:0] and the second data pads DQ[8:15].

In the XS mode in which only the first data pads DQ[0:7] are used, only the first data I/O unit 760 may operate. Accordingly, the first data I/O unit 760 may transfer the normal or training data between the first data pads DQ[0:7] and one of the first to fourth global lines GIO_UR[63:0], GIO_DR[63:0], GIO_UL[63:0] and GIO_DL[63:0]. The second data I/O unit 770 is disabled during the X8 mode.

The first data I/O unit 760 may include a first data output unit 762 and a first data input unit 764, and the second data I/O unit 770 may include a second data output unit 772 and a second data input unit 774. The first data I/O unit 760 may operate, irrespective of the bandwidth option and the normal and training modes. The second data I/O unit 770 may operate only during the X16 mode, irrespective of the normal and training modes.

The first data output unit 762 may output the data loaded on the first to fourth global lines GIO_UR[63:0], GIO_DR[63:0], GIO_UL[63:0] and GIO_DL[63:0] to the first data pads DQ[0:7]. The first data output unit 762 may include a first data selection multiplexer MUX5 and a first parallel-to-serial converter P2S5. The first data selection multiplexer MUX5 may selectively receive the data from one of the first to fourth global lines GIO_UR[63:0], GIO_DR[63:0], GIO_UL[63:0]' and GIO_DL[63:0] in parallel and the first parallel-to-serial converter P2S5 may serialize the received 64-bit data into 8-bit data and output the serialized 8-bit data to the first data pads DQ[0:7].

The first data output unit 762 may output the data loaded on one of the first to fourth global lines GIO_UR[63:0], GIO_DR[63:0], GIO_UL[63:0] and GIO_DL[63:0] to the first data pads DQ[0:7], irrespective of the bandwidth option.

The first data input unit 764 may include a first serial-to-parallel converter S2P5 and a first writer driver WD5. The first data input unit 764 may load the normal data inputted through the first data pads DQ[0:7] on one of the first to fourth global lines GIO_UR[63:0], GIO_DR[63:0], GIO_UL[63:0] and GIO_DL[63:0] in the normal mode. In the normal mode, the first serial-to-parallel converter S2P5 may parallelize 8-bit data inputted through the first data pads DQ[0:7] into 64-bit data and the first writer driver WD5 may drive one of the first to fourth global lines GIO_UR[63:0], GIO_DR[63:0], GIO_UL[63:0] and GIO_DL[63:0] with the 64-bit data.

Additionally, the first data input unit 764 may selectively transfer the training data from the first and second global lines GIO_UR[63:0] and GIO_DR[63:0] to the third and fourth global lines GIO_UR[63:0] and GIO_DL[63:0], respectively, according to the bandwidth option in the training mode. In the training mode, the first serial-to-parallel converter S2P5 and the first writer driver WD5 may selectively transfer the training data from the first and second global lines GIO_UR[63:0] and GIO_DR[63:0] to the third and fourth global lines GIO_UL[63:0] and GIO_DL[63:0], respectively during the X16 mode. Particularly, in the X16 mode and the training mode, the training data loaded on the first global line GIO_UR[63:0] may be transferred to the third global line GIO_UL[63:0] through the first writer driver WD5 and the first serial-to-parallel converter S2P5 or the training data loaded on the second global line GIO_DR[63:0] may be transferred to the fourth global line GIO_DL[63:0] through the first writer driver WD5 and the first serial-to-parallel converter S2P5.

In the normal mode, the first data input unit 764 may load the normal data inputted through the first data pads DQ[0:7] on one of the first to fourth global lines GIO_UR[63:0], GIO_DR[63:0], GIO_UL[63:0] and GIO_DL[63:0], irrespective of the bandwidth option. In the training mode, the first data input unit 764 may transfer the training data from the first and second global lines GIO_UR[63:0] and GIO_DR[63:0] to the third and fourth global lines GIO_UL[63:0] and GIO_DL[63:0], respectively, only during the X16 mode.

Figure 7:
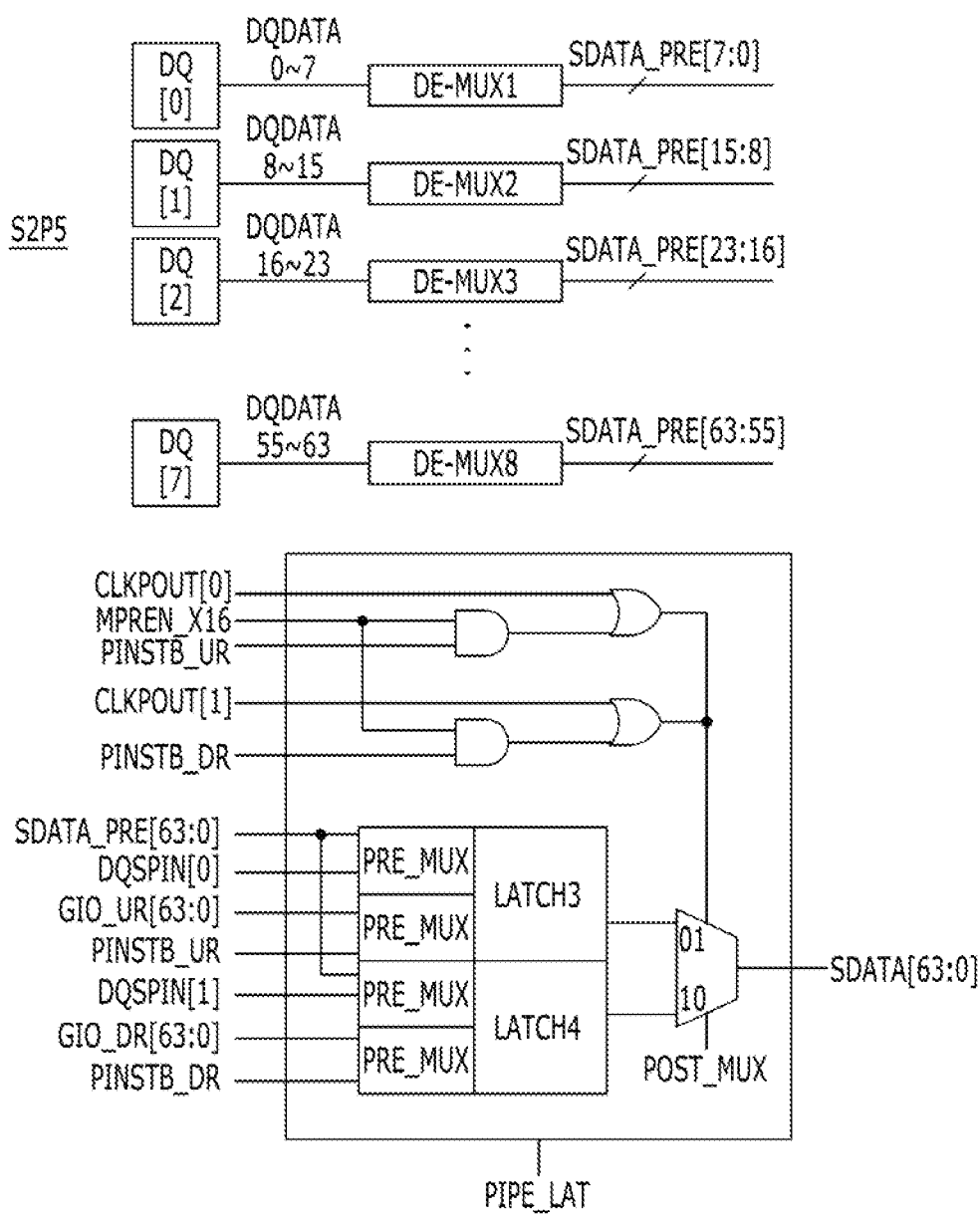
FIG. 7 is a detailed block diagram illustrating a first serial-to-parallel converter shown in FIG. 6.

FIG. 7 is a detailed block diagram illustrating the first serial-to-parallel converter S2P5 shown in FIG. 6.

Referring to FIG. 7, the first serial-to-parallel converter S2P5 may include a plurality of demultiplexers DEMUX1 to DEMUX8 and a pipe latch PIPE_LAT.

In the normal mode, the demultiplexers DEMUX1 to DEMUX8 may generate 64-bit parallel data SDATA_PRE[63:0] by de-multiplexing 64-bit data DQDATA 0~7, DQDATA 8~15, DQDATA 16~23, . . . , DQDATA 55~63, which are inputted through the first data pads DQ[0:7] in units of 8-bit serial data. The demultiplexers DEMUX1 to DEMUX8 may be the same as the demultiplexers shown in FIG. 4.

The pipe latch PIPE_LAT may generate the internal data SDATA[63:0] by performing the domain-crossing operation on the 64-bit parallel data SDATA_PRE[63:0]. Furthermore, the pipe latch PIPE_LAT may generate the internal data SDATA[63:0] by selectively receiving the training data transferred from the first and second global lines GIO_UR[63:0] and GIO_DR[63:0].

The pipe latch PIPE_LAT may include pre-multiplexers PRE_MUXs and latches LATCH3 and LATCH4 and a post-multiplexer POST_MUX.

The pre-multiplexers PRE_MUXs and latches LATCH3 and LATCH4 may store the 64-bit parallel data SDATA_PRE[63:0], which may correspond to the normal data, in response to strobe signals DQSPIN[0:1], which are synchronized with the data domain.

In accordance with the exemplary embodiment of the present invention, the pre-multiplexers PRE_MUXs and the latches LATCH3 and LATCH4 may selectively store the training data transferred from the first and second global lines GIO_UR[63:0] and GIO_DR[63:0] in response to first and second reference strobe signals PINSTB_UR and PINSTB_DR, which are outputted from the MPR 750. The first and second reference strobe signals PINSTB_UR and PINSTB_DR are generated in the training mode and thus the training data transferred from the first and second global lines GIO_UR[63:0] and GIO_DR[63:0] may be stored in the latches LATCH3 and LATCH4 only in the training mode. When a control signal MPREN_X16 denoting the X16 mode of the training mode is activated, the post-multiplexer POST_MUX may output the training data transferred from the first global line GIO_UR[63:0] and stored in the latch LATCH3 or the training data transferred from the second global line GIO_DR[63:0] and stored in the latch LATCH4 as the internal data SDATA[63:0] to the post-multiplexer POST_MUX in response to the first and second reference strobe signals PINSTB_UR and PINISTB_DR.

The post-multiplexer POST_MUX may output the 64-bit parallel data SDATA_PRE[63:0] stored in the latches LATCH3 and LATCH4 as the internal data SDATA[63:0] in response to clock signals CLKPOUT[0:1] which are synchronized with a clock domain.

Thereafter, the first write driver WD5 may receive the internal data SDATA[63:0] from the first serial-to-parallel converter S2P5 and selectively transfer the internal data SDATA[63:0] to the first to fourth global lines GIO_UR[63:0] GIO_DR[63:0] GIO_UL[63:0] and GIO_DL[63:0] according to the bandwidth option and the normal and training mode.

Figure 8:
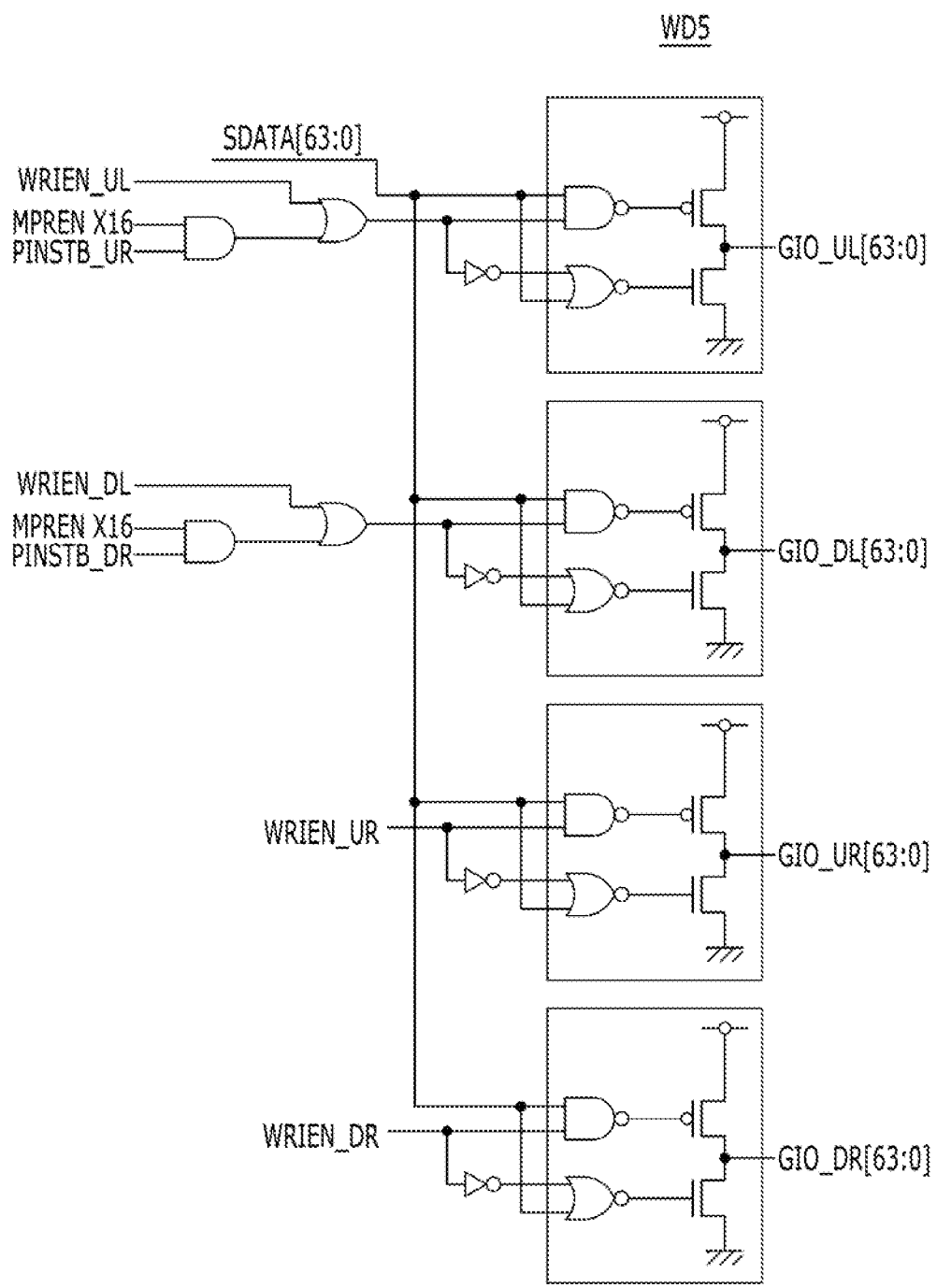
FIG. 8 is a detailed circuit diagram illustrating a first write driver shown in FIG. 6.

FIG. 8 is a detailed circuit diagram illustrating the first write driver WD5 shown in FIG. 6.

Referring to FIG. 8, the first write driver WD5 drives one of the first to fourth global lines GIO_UR[63:0], GIO_DR[63:0], GIO_UL[63:0] and GIO_DL[63:0] with the internal data SDATA[63:0] which are outputted from the first serial-to-parallel converter S2P5.

In the normal mode, the internal data SDATA[63:0] outputted from the first serial-to-parallel converter S2P5 may correspond to the 64-bit parallel data SDATA_PRE[63:0] or the normal data. However, in the training mode, the internal data SDATA[63:0] outputted from the first serial-to-parallel converter S2P5 may correspond to the training data transferred from the first global line GIO_UR[63:0] or the second global line GIO_DR[63:0].

In the normal mode, the first write driver WD5 may select one of the first to fourth global lines GIO_UR[63:0], GIO_DR[63:0], GIO_UL[63:0] and GIO_DL[63:0] in response to control signals WRIEN_UL, WRIEN_DL, WRIEN_UR, and WRIEN_DR, and load the internal data SDATA[63:0] on the selected one of the first to fourth global lines GIO_UR[63:0], GIO_DR[63:0], GIO_UL[63:0] and GIO_DL[63:0]. The control signals WRIEN_UL, WRIEN_DL, WRIEN_UR, and WRIEN_DR may be activated in response to an address (not shown) applied from outside and according to the bandwidth option.

When the control signal MPREN_X16 denoting the X16 mode of the training mode is activated, the first write driver WD5 may receive the internal data SDATA[63:0] or the training data transferred from the first global line GIO_UR[63:0] or the second global line GIO_DR[63:0] through the first serial-to-parallel converter S2P5 and selectively transfer the internal data SDATA[63:0] to the third and fourth global lines GIO_UL[63:0] and GIO_DL[63:0] in response to the first and second reference strobe signals PINSTB_UR and PINSTB_DR outputted from the MPR 750.

Referring back to FIG. 6, the second data output unit 772 may be enabled according to the X16 mode and output the normal or training data loaded on the third and fourth global lines GIO_UL[63:0] and GIO_DL[63:0] to the second data pads DQ[8:15]. The second data output unit 772 may include a second data selection multiplexer MUX6 and a second parallel-to-serial converter P2S6. The second data selection multiplexer MUX6 may selectively receive the normal or training data from one of the third and fourth global lines GIO_UL[63:0] and GIO_DL[63:0] in parallel. The second parallel-to-serial converter P2S6 may serialize the received 64-bit data into 8-bit data and output the serialized 8-bit data to the second data pads DQ[8:15].

Thus, in the normal mode, the second data output unit 772 may be enabled only during the X16 mode. In the training mode, the second data output unit 772 may be enabled to output the training data transferred from the first global line GIO_UR[63:0] or the second global line GIO_DR[63:0] and loaded on one of the third and fourth global lines GIO_UL[63:0] and GIO_DL[63:0] to the second data pads DQ[8:15] only during the X16 mode.

The second data input unit 774 may be enabled according to the X16 mode and load the normal data inputted through the second data pads DQ[8:15] on one of the third and fourth global lines GIO_UL[63:0] and GIO_DL[63:0], The second data input unit 774 may include a second serial-to-parallel converter S2P6 and a second writer driver WD6. The second serial-to-parallel converter S2P6 may parallelize the 8-bit data inputted through the second data pads DQ[8:15] into the 64-bit data and the second writer driver WD6 may drive one of the third and fourth global lines GIO_UL[63:0] and GIO_DL[63:0] with the 64-bit data.

Accordingly, in the normal mode, the second data input unit 774 may be enabled only during the X16 mode. The second data input unit 774 may operate only during the X16 mode, irrespective of the normal and training modes.

In accordance with the embodiment of the present invention, the semiconductor memory device allows an internal storage to be shared both for receiving the normal data to be loaded on a plurality of global lines in a normal mode and for transferring the training data between the global lines in a training mode. Thus, the semiconductor memory device may efficiently transfer the training data between the global lines during the X16 mode, thereby reducing the size of the semiconductor device.

Positions and types of logic gates and transistors exemplified in the above-described embodiments may be differently realized according to the polarities of the signals inputted thereto.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
   a first global line suitable for inputting/outputting data from/to a first bank;
   a second global line suitable for inputting/outputting data from/to a second bank;
   a multi-purpose register (MPR) suitable for loading data having a predetermined value on the first global line in a training mode;
   a first data input/output (I/O) unit suitable for inputting/outputting data between one of the first and second global lines and a first data pad and selectively transferring data loaded on the first global line to the second global line in response to a bandwidth option in the training mode; and
   a second data I/O unit enabled in response to the bandwidth option, suitable for inputting/outputting data between the second global line and a second data pad,
   wherein the first data I/O unit includes:
      a first data output unit suitable for outputting data from one of the first and second global lines to the first data pad; and
      a first data input unit suitable for loading data inputted through the first data pad on one of the first and second global lines in a normal mode and selectively transferring the data from the first global line to the second global line in response to the bandwidth option in the training mode.

2. The semiconductor memory device of claim 1, wherein, in a first bandwidth mode, the first data input unit loads the data inputted through the first data pad on one of the first and second global lines in the normal mode and does not transfer the data from the first global line to the second global line in the training mode.

3. The semiconductor memory device of claim 1, wherein, in a second bandwidth mode, the first data input unit loads the data inputted through the first data pad on the first global line in the normal mode and transfers the data from the first global line to the second global line in the training mode.

4. The semiconductor memory device of claim 1, wherein the first data output unit outputs the data from one of the first and second global lines to the first data pad in a first bandwidth mode and outputs the data from the first global line to the first data pad in a second bandwidth mode.

5. The semiconductor memory device of claim 1, wherein the second data I/O unit includes:
   a second data output unit enabled in response to the bandwidth option, suitable for outputting data from the second global line to the second data pad; and
   a second data input unit enabled in response to the bandwidth option, suitable for loading data inputted through the second data pad on the second global line.

6. The semiconductor memory device of claim 5, wherein the second data input unit is disabled in the first bandwidth mode and is enabled to load the data inputted through the second data pad on the second global line in a second bandwidth mode.

7. The semiconductor memory device of claim 5, wherein the second data output unit is disabled in the first bandwidth mode and is enabled to output the data from the second global line to the second data pad in a second bandwidth mode.

8. A semiconductor memory device comprising:
   a first global line suitable for inputting/outputting data from/to a first bank;
   a second global line suitable for inputting/outputting data from/to a second bank;
   a third global line suitable for inputting/outputting data from/to a third bank;
   a fourth global line suitable for inputting/outputting data from/to a fourth bank;
   a multi-purpose register (MPR) suitable for loading data having a predetermined value on the first global line in a training mode;
   a first data input/output (I/O) unit suitable for inputting/outputting data between one of the first to fourth global lines and a first data pad and selectively transferring data loaded on the first and second global lines to the third and fourth global lines, respectively, in response to a bandwidth option in the training mode; and
   a second data I/O unit enabled in response to the bandwidth option, suitable for inputting/outputting data between one of the third and fourth global lines and a second data pad,
   wherein the first data I/O unit includes:
      a first data output unit suitable for outputting data from one of the first to fourth global lines to the first data pad; and
      a first data input unit suitable for loading data inputted through the first data pad on one of the first to fourth global lines in a normal mode and selectively transferring the data from the first and second global lines to the third and fourth global lines,
   respectively, in response to the bandwidth option in the training mode.

9. The semiconductor memory device of claim 8, wherein, in a first bandwidth mode, the first data input unit loads the data inputted through the first data pad on one of the first to fourth global lines in the normal mode and does not transfer the data from the first and second global lines to the third and fourth global lines, respectively, in the training mode.

10. The semiconductor memory device of claim 8, wherein, in a second bandwidth mode, the first data input unit loads the data inputted through the first data pad on one of the first and second global lines in the normal mode and transfers the data from the first and second global lines to the third and fourth global lines, respectively, in the training mode.

11. The semiconductor memory device of claim 8, wherein the first data output unit outputs the data from one of the first to fourth global lines to the first data pad in a first bandwidth mode, and outputs the data from one of the first and second global lines to the first data pad in a second bandwidth mode.

12. The semiconductor memory device of claim 8, wherein the second data I/O unit includes:
   a second data output unit enabled in response to the bandwidth option, suitable for outputting data from one of the third and fourth global lines to the second data pad; and
   a second data input unit enabled in response to the bandwidth option, suitable for loading data inputted through the second data pad on one of the third and fourth global lines.

13. The semiconductor memory device of claim 12, wherein the second data input unit is disabled in a first bandwidth mode, and is enabled to load the data inputted through the second data pad on one of the third and fourth global lines in a second bandwidth mode.

14. The semiconductor memory device of claim 12, wherein the second data output unit is disabled in a first bandwidth mode and is enabled to output the data loaded on one of the third and fourth global lines to the second data pad in a second bandwidth mode.

15. A semiconductor memory device comprising:
   a first group of global lines;
   a second group of global lines;
   a first unit coupled to both of the first and second groups and suitable for transferring a first data between a first data pad group and one of the first and second groups; and
   a second unit coupled to the second group and suitable for transferring a second data between a second data pad group and the second group during an extended bandwidth mode in which a data input/output operation is performed with the first and second data pad groups,
   wherein the first unit further transfers a preset data having a preset data pattern from the first group to the second group during the extended bandwidth mode, without transferring the preset data from the first group to the second group during a default bandwidth mode in which the data input/output operation is performed with one of the first and second data pad groups.

16. The semiconductor memory device of claim 15, wherein the first unit includes:
   a first output unit suitable for transferring the first data or the preset data from one of the first and second groups to the first data pad group; and
   a first input unit suitable for transferring the first data from the first data pad group to one of the first and second groups and the preset data from the first group to the second group.

17. The semiconductor memory device of claim 15, wherein the first data is a normal data stored or to be stored in a first group of memory banks and the second data is a normal data stored or to be stored in a second group of memory banks.

18. The semiconductor memory device of claim 15, wherein the second unit includes:
   a second output unit suitable for transferring the second data or the preset data from the second groups to the second data pad group; and
   a second input unit suitable for transferring the second data from the second data pad group to the second groups.

* * * * *